(12) United States Patent
Piguet et al.

(10) Patent No.: US 6,323,710 B1
(45) Date of Patent: Nov. 27, 2001

(54) D-TYPE MASTER-SLAVE FLIP-FLOP

(75) Inventors: Christian Piguet, Neuchatel;
Jean-Marc Masgonty, Corcelles;
Claude Arm, Cortaillod, all of (CH)

(73) Assignee: CSEM Centre Suisse d'Electronique et de Microtechnique SA, Neuchatel (CH)

( * ) Notice: Subject to any disclaimer, the term of this patent is extended or adjusted under 35 U.S.C. 154(b) by 0 days.

(21) Appl. No.: 09/434,342

(22) Filed: Nov. 5, 1999

(30) Foreign Application Priority Data

Nov. 6, 1998 (FR) .................................................. 98 14018

(51) Int. Cl.[7] ............................ H03K 3/12; H03K 3/037; H03K 3/286; H03K 3/356
(52) U.S. Cl. ............................ 327/218; 327/202; 327/225
(58) Field of Search ..................................... 327/198, 202, 327/203, 215, 218, 219, 225

(56) References Cited

U.S. PATENT DOCUMENTS

| | | | |
|---|---|---|---|
| 3,588,546 | * 6/1971 | Lagamann | 327/215 |
| 3,622,803 | 11/1971 | Cooper | 327/202 |
| 4,506,165 | 3/1985 | Gulati | 327/203 |
| 4,797,575 | 1/1989 | Lofgren | 327/202 |
| 5,781,053 | * 6/1998 | Ramirez | 327/215 |
| 5,786,719 | * 6/1998 | Furutani | 327/202 |

\* cited by examiner

*Primary Examiner*—Terry D. Cunningham
*Assistant Examiner*—Quan Tra

(57) ABSTRACT

A D-type master-slave flip-flop includes a master unit receiving an input variable and producing two first intermediate variables, a transfer unit including at least two logic gates and a clock connection connected to one input of each of the gates, which are adapted to supply two second intermediate variables as a function of the input variable and the clock signal and are looped to the master unit, and a slave unit to form at least one output variable. Another input of a first gate of the transfer unit is connected to the master unit to receive directly the true value of one of the variables supplied by the master unit. Another input of the second gate of the transfer unit is connected to the master unit to receive therefrom the complement of the same variable. The second intermediate variables are independent of each other. The flip-flop has the advantage that it is insensitive to the slopes of the flanks of the clock signals.

20 Claims, 6 Drawing Sheets

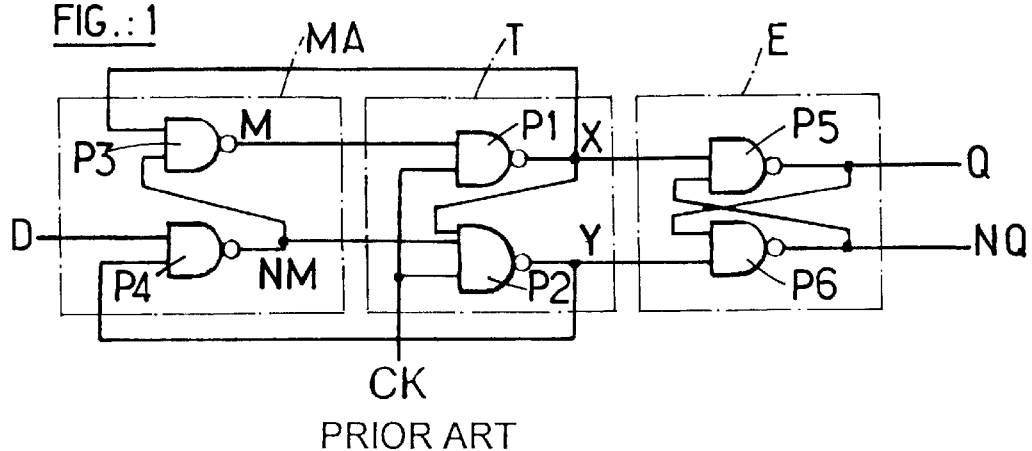
FIG.:1
PRIOR ART
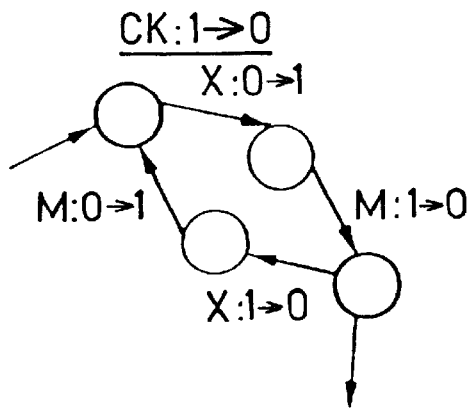
FIG.:2
PRIOR ART
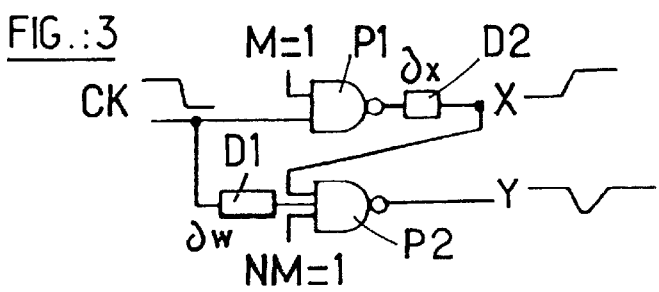
FIG.:3
PRIOR ART

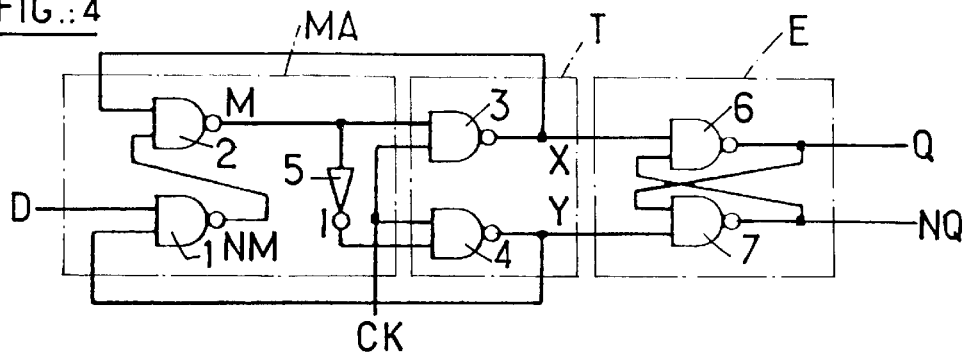
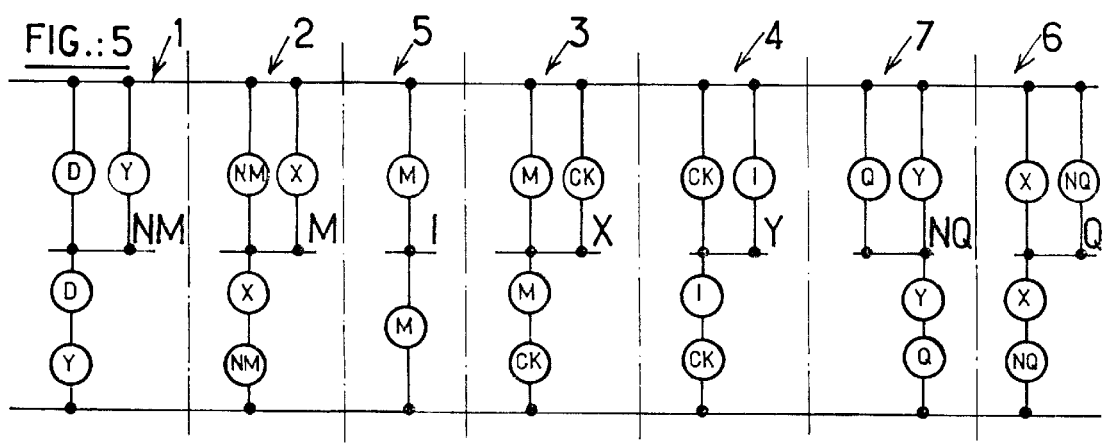
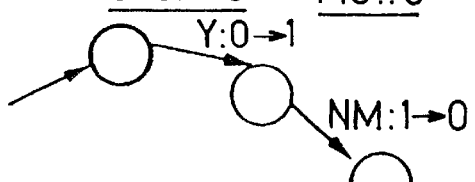
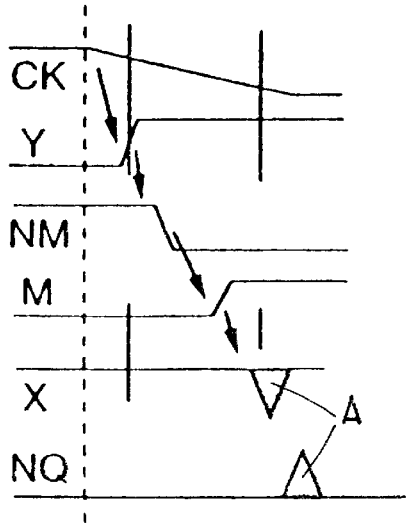
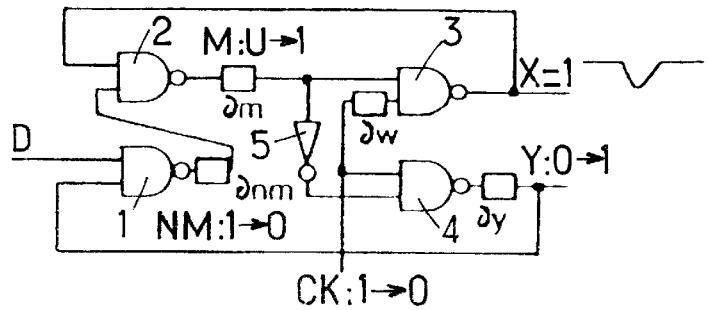

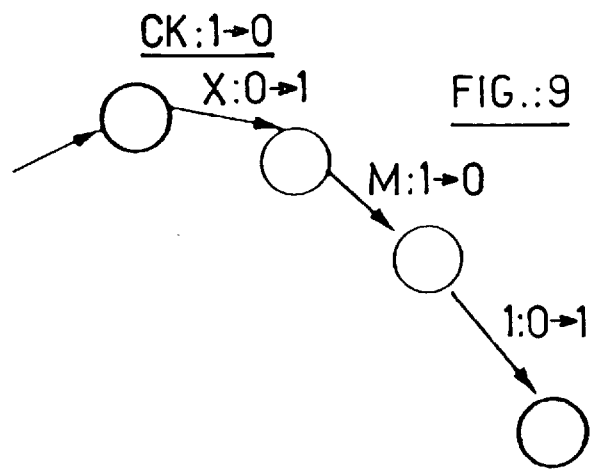
FIG.:9
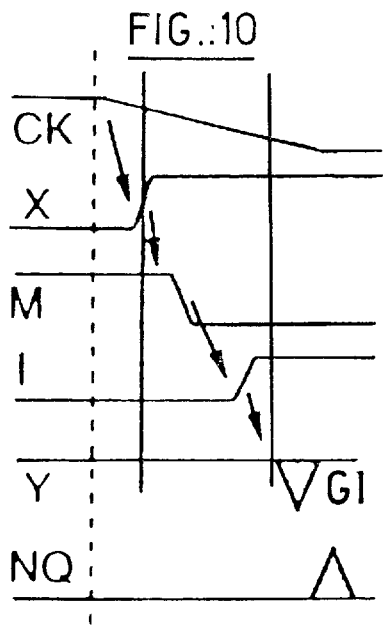
FIG.:10
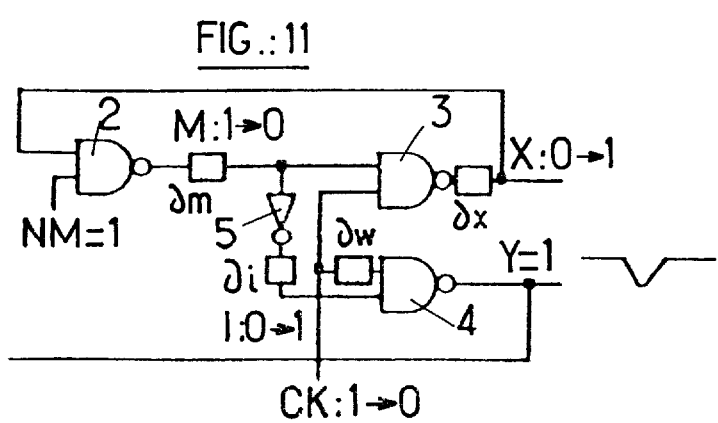
FIG.:11

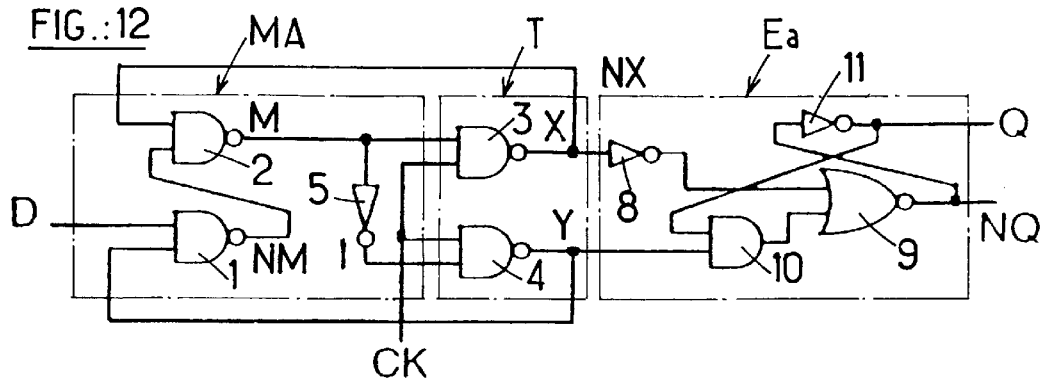
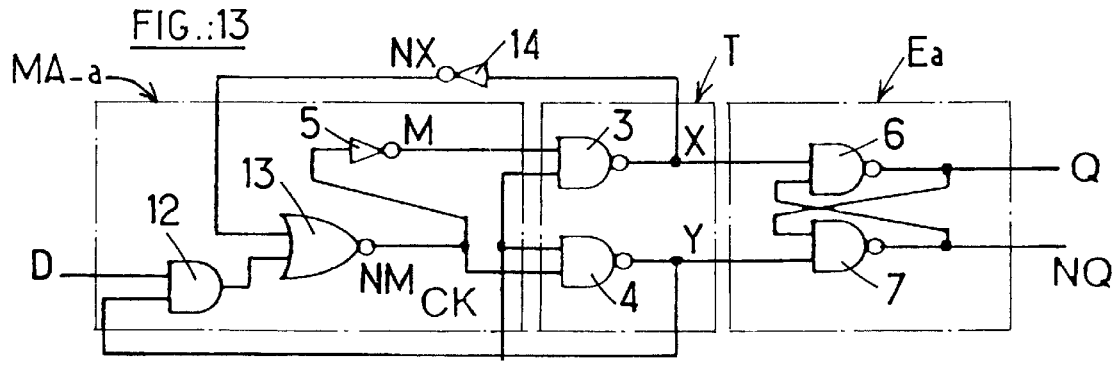
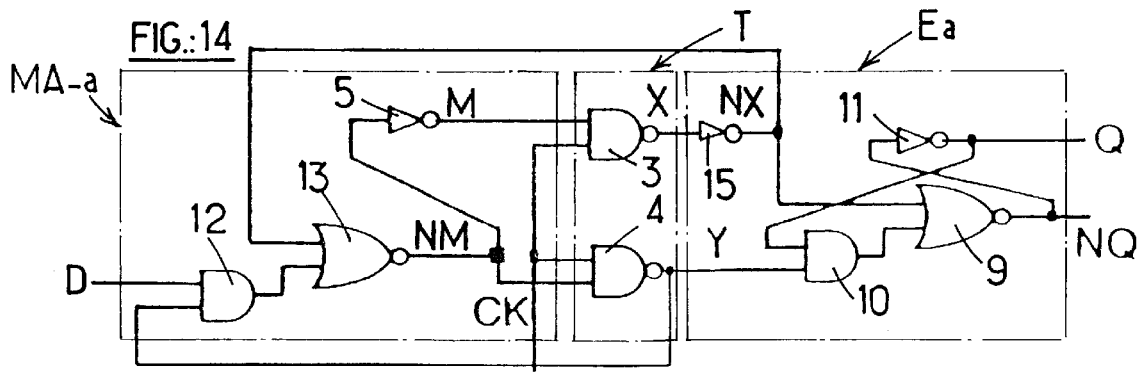

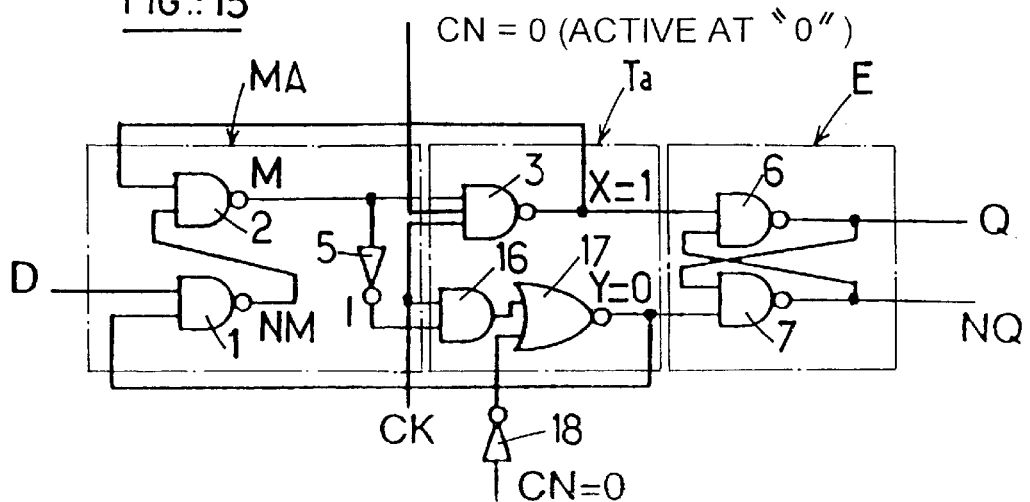
FIG.: 15
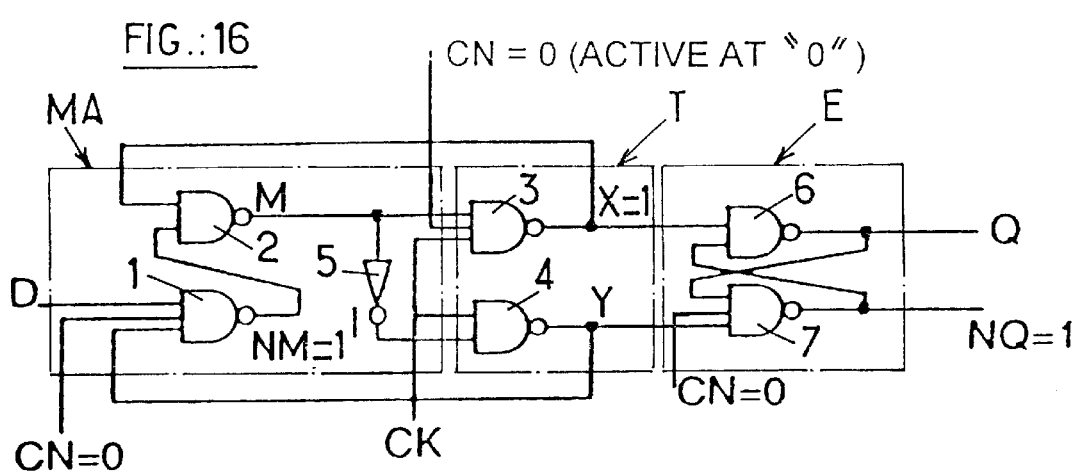
FIG.: 16
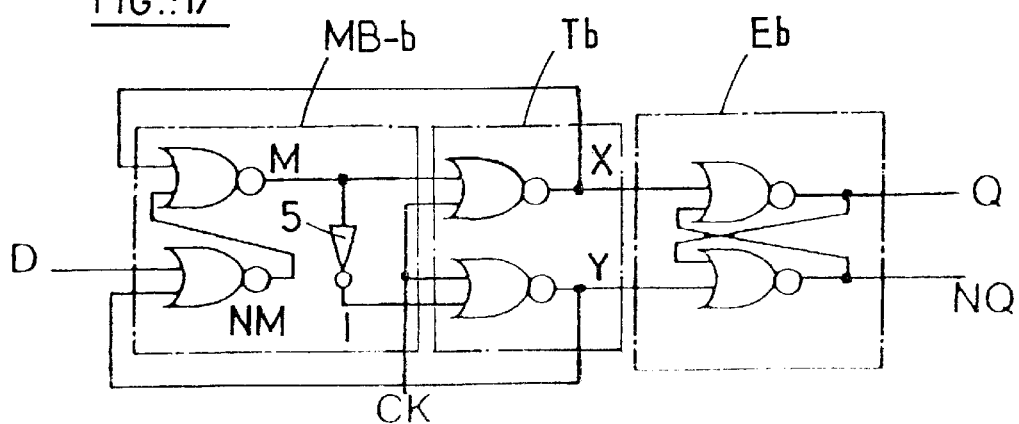
FIG.: 17

FIG.: 18
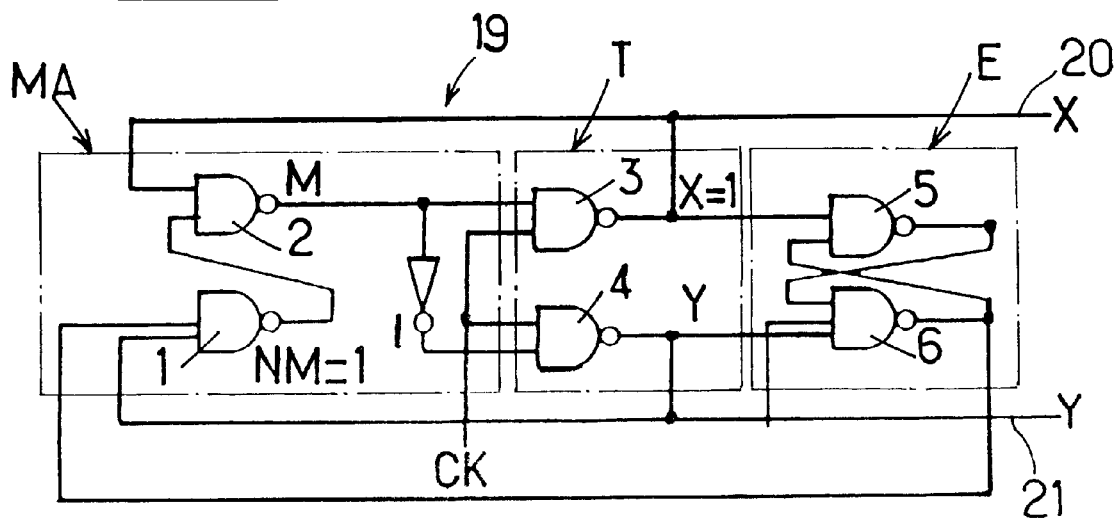
FIG.: 19
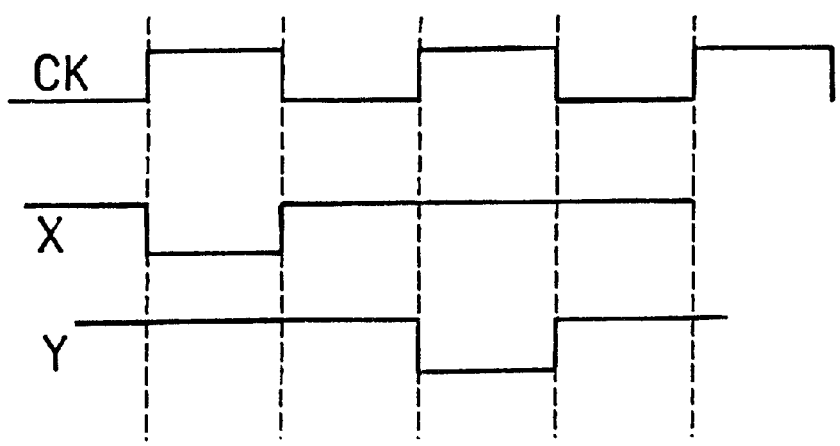

D-TYPE MASTER-SLAVE FLIP-FLOP

BACKGROUND OF THE INVENTION

1. Field of the Invention

The present invention concerns a D-type master-slave flip-flop, advantageously one implemented in the CMOS technology.

2. Description of the Prior Art

A master-slave flip-flop of the above kind is described in "Analyse et synthèse des systèmes logiques" ["Analysis and synthesis of logic systems"], by D. Mange, Vol. V of "Traité d'électricité" ["Treatise on electricity"], Ecole Polytechnique Fédérale de Lausanne, Switzerland, published by Editions Georgi, 1978, page 260.

As shown in FIG. 1 on the accompanying drawings, the prior art master-slave flip-flop includes a master unit MA receiving an input variable D and producing two first intermediate variables M and NM, both of which are a function of the input variable. The master-slave flip-flop also includes a slave unit E adapted to form at least one output variable Q and/or NQ of the flip-flop from said first intermediate variables M and NM. A transfer unit T connected between the master unit MA and the slave unit E respectively includes, for each of said output variables Q and NQ, at least one logic gate P1 and P2 adapted to combine the first intermediate variables N and NM applied to it with a clock signal CK, producing two second intermediate variables X and Y which are applied to the slave unit E.

In the prior art embodiment shown, the master unit MA comprises two NAND gates P3 and P4 and the slave unit E comprises two NAND gates P5 and P6.

The essential advantages of this type of prior art flip-flop are that they have no race (critical travel) and do not need a clock inverter. Also, the clock signal is applied only to gates P1 and P2 of the transfer unit T. See document EP 0 734 122 for a detailed explanation of the "race" concept (which is well known in the art).

However, these flip-flops have a drawback due to their sensitivity to the slope of the rising or falling edge of the pulses of the clock signal CK.

FIGS. 2 and 3 of the appended drawings show the consequences of this sensitivity of the flip-flop to the slope of the clock signal. FIG. 2 shows that, if the clock signal CK changes state, for example from "1" to "0", the variable X goes from "0" to "1" and the variable M goes from "1" to "0". Considering the variable Y during this same process, it can be seen that the rise in the variable X creates an uncertainty or glitch in the variable Y if the clock signal is relatively slow to reach its low level.

FIG. 3 shows this phenomenon by means of a model of the transfer unit T whose gate P2 receives the clock signal CK subject to a time-delay D1 of duration δw and whose gate P1 supplies the variable X subject to a time-delay D2 of duration δx. There is a glitch in the variable Y if δw>δx, which can result from an erroneous change of state of the slave unit E in response to a 1→0→1 glitch in the variable Y.

The object of the invention is to provide a D-type master-slave flip-flop in which the influence of the slope of the flanks of the clock signal pulse is greatly reduced, if not completely eliminated.

SUMMARY OF THE INVENTION

The invention therefore consists in a CMOS D-type master-slave flip-flop including:

a master unit receiving an input variable and producing two first intermediate variables as a function of the input variable, a transfer unit connected to the master unit and including at least two logic gates and a clock connection adapted to receive a clock signal and which is connected to one input of each of the gates, which are adapted to supply respective second intermediate variables as a function of the input variable and the clock signal and are looped to the master unit, and a slave unit connected to the transfer unit to form at least one output variable of the flip-flop from the second intermediate variables, wherein:

another input of a first gate of the transfer unit is connected to the master unit to receive directly the true value of one of the variables supplied by the master unit, another input of the second gate of the transfer unit is connected to the master unit to receive therefrom the complement of the same first intermediate variable, and the second intermediate variables are independent of each other.

With a D-type flip-flop having the above features there is a very low risk of generating unstable situations corresponding to glitches. The flip-flop can be implemented using a small number of transistors, without compromising the switching time, and can use a branch topography in which each branch includes only one P-type transistor and at most two N-type transistors in series.

According to other advantageous features of the invention:

the master unit comprises an inverter to provide the complement of the same first intermediate variable;

the master, transfer and slave units each comprise two NAND gates or two NOR gates;

a first gate of the master unit is adapted to receive at a first input the input variable and at a second input one of the looped intermediate variables, a second gate of the master unit is adapted to receive at a first input the output of the first gate and at a second input the other of the looped second variables, and the output of the second gate is connected to an input of the first and second gates of the transfer unit, respectively directly and via the inverter;

the master unit comprises an AND gate receiving at its inputs the input variable and one of the looped second intermediate variables and a NOR gate having one input connected to the output of the AND gate and adapted to receive at another input the other looped intermediate second variable, the output of the NOR gate being connected to the transfer unit and to the inverter;

the slave unit includes two logic gates each having a first input connected to receive a respective one of the second intermediate variables and a second input connected to the output of the other logic gate of the slave unit, the outputs of the logic gates each delivering one of the output variables;

the slave unit comprises an AND gate, one input of which is adapted to receive one of the second intermediate variables and whose output is connected to a first input of a NOR gate whose other input is adapted to receive, in inverted form, the other of the second intermediate variables, the other input of the AND gate is connected to the output of an inverter supplying a first of the output variables, and the output of the NOR gate is connected to the inverter and supplies the other of the output variables;

the transfer unit has an additional control input on at least one of its gates to confer a set or reset function on the flip-flop.

The invention also consists in the use of a D-type master-slave flip-flop as defined above as a divider by 2, wherein one of the output variables is looped to constitute the input variable and the second output variables constitute outputs in antiphase at a frequency which is half the frequency of the clock signal.

Other features and advantages of the invention will become apparent in the course of the following description, which is given by way of example only and with reference to the accompanying drawings.

BRIEF DESCRIPTION OF THE DRAWINGS

FIG. 1 is a logic diagram of a prior art D-type master-slave flip-flop.

FIG. 2 is a graph illustrating the operation of a portion of the flip-flop shown in FIG. 1.

FIG. 3 is a diagram of a simulation of time-delays involved in the operation of the master-slave flip-flop shown in FIG. 1.

FIG. 4 is a logic diagram of a first embodiment of a D-type master-slave flip-flop of the invention.

FIG. 5 is a diagram showing a branch topography by means of which the master-slave flip-flop shown in FIG. 4 is preferably implemented.

FIG. 6 is a graph showing the operation of a part of the master-slave flip-flop shown in FIGS. 4 and 5 at the time of a transition in one of the intermediate variables from its transfer unit.

FIG. 7 is a timing diagram illustrating the operation of the master-slave flip-flop in the same situation but in a different manner.

FIG. 8 is a logic diagram of a simulation of time-delays involved in the operation of the flip-flop shown in FIG. 4.

FIGS. 9, 10 and 11 are diagrams respectively analogous to those of FIGS. 6, 7 and 8 for a transition in the other intermediate variable from the transfer unit of the master-slave flip-flop.

FIGS. 12, 13 and 14 show three other embodiments of a D-type master-slave flip-flop in accordance with the invention.

FIGS. 15 and 16 show two logic diagrams of a master-slave flip-flop as shown in FIGS. 4 and 5 provided with a reset function.

FIG. 17 is a logic diagram of a D-type master-slave flip-flop in accordance with the invention using gates with the opposite logic to that of the gates used in the previous figures.

FIG. 18 shows the use of a D-type master-slave flip-flop of the invention as a divider by 2 to constitute a phase generator between two streams of pulses.

FIG. 19 is a timing diagram illustrating the operation of the divider by 2 shown in FIG. 18.

DETAILED DESCRIPTION OF THE PREFERRED EMBODIMENT

FIG. 4 shows a first embodiment of a D-type master-slave flip-flop of the invention.

The flip-flop comprises a master unit M and a slave unit E between which is a transfer unit T.

The master unit MA comprises a first NAND gate 1 receiving a variable D at one input and supplying at its output an intermediate variable NM. It also comprises a second NAND gate 2 which delivers another intermediate variable M and one input of which is connected to the output of the gate 1. The two intermediate variables M and NM are referred to as "first intermediate variables" hereinafter.

The transfer unit includes first and second NAND gates 3 and 4. One input of each gate 3 and 4 is connected to receive a clock signal CK. The other input of gate 3 is connected to the output of gate 2 to receive the first intermediate variable M. The other input of gate 4 is connected to the output of an inverter 5 which delivers a variable I at its output and whose input is connected to the output of gate 2 to receive the first intermediate variable M.

The outputs of NAND gates 3 and 4 are respectively connected to another input of gates 2 and 1. They deliver respective intermediate variables X and Y, which are therefore looped to the master unit MA and which are referred to as "second intermediate variables" hereinafter.

The slave unit E comprises two NAND gates 6 and 7 each of which has one input connected to an output of gates 3 and 4 to receive one of the second intermediate variables X or Y. The other inputs of gates 6 and 7 are respectively cross-connected to each other's outputs and supply the output variables Q and NQ.

As shown in FIG. 5, the D-type master-slave flip-flop shown in FIG. 4 preferably uses the CMOS technology and a branch topography. A more detailed description of this type of topography can be found in the European patent previously referred to. This diagram shows only 26 transistors.

Referring to FIG. 4, note that gates 3 and 4 of the transfer unit T are the only gates of the circuit to which the clock signal is applied and that the second intermediate variables X and Y are independent of each other in that neither of the two gates has its output connected to the input of the other one.

When the clock signal CK goes to the low level (see FIG. 6), the variable Y goes to the high level, after which the variable NM goes to the low level, after which the variable M goes to the high level.

The FIG. 7 timing diagram shows that when the process shown in FIG. 6 unfolds there can only be a glitch A in the operation of gate 3 if the cumulative transition delay of gates 1, 2 and 4 is greater than the input delay for the clock signal CK to pass through gate 3. In other words, and as shown in the FIG. 8 simulation diagram, a glitch can occur only if $\delta w > \delta y + \delta nm + \delta m$, where $\delta w$, $\delta y$, $\delta nm$ and $\delta m$ are respectively the delays introduced by the clock signal CK and by the gates 1, 2 and 4. The above conditions can easily be complied with and it is therefore a simple matter to prevent a glitch.

FIGS. 9, 10 and 11 show in the same way that no glitch A can occur at gate 4 if the delay $\delta w$ remains less than $\delta x + \delta m + \delta i$, where $\delta x$ and $\delta i$ are respectively the delays introduced by gate 3 and by the inverter 5.

FIG. 12 shows another embodiment of the invention which differs from that shown in FIG. 4 only in that it includes a different slave unit Ea.

The slave unit Ea comprises a first inverter 8 connected to the output of the transfer unit T delivering the variable X. The inverter is connected to the first input of a NOR gate 9 whose output delivers the variable NQ of the master-slave flip-flop. The other input of the NOR gate is connected to the output of an AND gate 10. One input of the AND gate is connected to the other output of the transfer unit T delivering the variable Y. The other input of the AND gate 10 is connected to the output of an inverter 11 delivering the other output variable Q of the D-type flip-flop. The input of the inverter 11 is connected to the output of gate 9.

In the embodiment shown in FIG. 13, the transfer unit T and the slave unit E are identical to those shown in FIG. 4. On the other hand, the flip-flop shown in FIG. 13 comprises a master unit MA-a with a different structure. Here the variable D is applied to an AND gate 12 whose other input receives the second intermediate variable Y from gate 4 of the transfer unit T. The output of the AND gate 12 is connected to one input of a NOR gate 13 whose output delivers one of the first variables NM to one input of gate 4 and to the inverter 5 which here supplies the variable M as the other intermediate variable of the master unit MA-a. The variable X is applied to an inverter 14 which therefore supplies a variable NX to the other input of the NOR gate 13.

The embodiment of the master-slave flip-flop of the invention shown in FIG. 14 includes a transfer unit T identical to that shown in FIG. 4, a master unit MA-a like that shown in FIG. 13 and a slave unit Ea having the structure of that shown in FIG. 12. Note that in this embodiment the inverters 8 and 14 can be combined in a single inverter 15 delivering the variable NX.

In principle the master-slave flip-flop shown in FIG. 15 conforms to that shown in FIG. 4 except that it includes a transfer unit Ta providing the flip-flop with a "reset" function. To this end the transfer unit Ta includes the combination of an AND gate 16 and a NOR gate 17 instead of the gate 4 delivering the variable Y.

Respective inputs of the AND gate 16 are connected to receive the clock variable CK and the variable I from the inverter 5 of the master unit MA. Its output is connected to one input of the NOR gate 17 which receives a reset variable CN at its other input via an inverter 18. Gate 3 has an additional input also receiving the reset variable CN. When this variable is active (at "0"), gates 3 and 16, 17 are conditioned to deliver X=1 and Y=0, which causes both the master MA and the slave E to change state.

FIG. 16 shows an embodiment of a master-slave flip-flop with reset function in which the reset signal represented by the variable CN acts on gates 1, 3 and 7, which all have an additional input for this purpose. In this case, when the signal CN=0, the variables NM, X and NQ are forced to "1" and the variables M, Y and Q are forced to "0".

In an analogous fashion, it is possible to implement a D-type master-slave flip-flop with a "set" function by reversing the roles of the groups of gates respectively delivering the variables NM, X and NQ and the variables M, Y and Q. This embodiment will be obvious to the skilled person, given the FIGS. 15 and 16 diagrams, and is neither described nor shown in more detail.

FIG. 17 shows an embodiment of the master-slave flip-flop of the invention using the opposite logic, the NAND gates from FIG. 4 being replaced by NOR gates in the master unit MA-b, the slave unit Eb and the transfer unit Tb. This flip-flop can be obtained with the same number (26) of MOS transistors as the flip-flop shown in FIG. 4.

FIGS. 18 and 19 show the use of the master-slave flip-flop of the invention as a divider 19 which divides by 2 and which supplies at its outputs 20 and 21 signals in antiphase at a frequency which is half that of the clock signal CK (in reality these signals are the second intermediate variables X and Y). In this case, the variable D from FIG. 4 is the variable NQ delivered by the slave unit E and the outputs of gates 3 and 4 deliver respective output signals of the divider. FIG. 19 is a timing diagram for the signals CK, X and Y.

In all the embodiments of the master-slave flip-flop in accordance with the invention described, independence from the slope of the clock signal can be obtained by making the second intermediate variables X and Y delivered by the transfer unit independent of each other.

With regard to implementing the D-type master-slave flip-flop of the invention, note further that in almost all the embodiments described the branch topography has only one P-type transistor and only two N-type transistors in each branch, this feature being advantageous from the point of view of the operating speed of the flip-flop.

There is claimed:

1. An MOS D-type master-slave flip-flop including:
   a master unit receiving an input variable and producing two first intermediate variables as a function of said input variable,
   a transfer unit connected to said master unit and including at least two logic gates and a clock connection for applying a clock signal to one input of each of said gates, said gates supplying respective second intermediate variables as a function of said input variable and said clock signal and being looped to said master unit, none of said gates having an output connected to the input of any of the other of said gates, and
   a slave unit connected to said transfer unit to form at least one output variable of said flip-flop from said second intermediate variables,
   wherein:
      another input of a first gate of said transfer unit is connected to said master unit to receive directly the true value of one of said variables supplied by said master unit, and
      another input of the second gate of said transfer unit is connected to said master unit to receive therefrom the complement of the same first intermediate variable.

2. The D-type master-slave flip-flop claimed in claim 1 wherein said master unit comprises an inverter to provide the complement of said same first intermediate variable.

3. The D-type master-slave flip-flop claimed in claim 1 wherein said master, transfer and slave units each comprise two NAND gates.

4. The D-type master-slave flip-flop claimed in claim 1 wherein said master, transfer and slave units each comprise two NOR gates.

5. The D-type master-slave flip-flop claimed in claim 3 including:
   a first gate of said master unit including a first input to which said input variable is applied and a second input to which one of said looped intermediate variables, is applied, and
   a second gate of said master unit including a first input to which the output of said first gate is applied and a second input to which the other of said looped second variables is applied,
   wherein the output of said second gate of said master unit is connected to an input of said first and second gates of said transfer unit, respectively directly and via said inverter.

6. The D-type master-slave flip-flop claimed in claim 4 including:
   a first gate of said master unit including a first input to which said input variable is applied and a second input to which one of said looped intermediate variables is applied, and a second gate of said master unit including a first input to which the output of said first gate is applied and a second input to which the other of said looped second variables is applied, wherein the output of said second gate is connected to an input of said first and second gates of said transfer unit, respectively directly and via said inverter.

7. The D-type master-slave flip-flop claimed in claim 1 wherein said master unit comprises an AND gate receiving at its inputs said input variable and one of said looped second intermediate variables and a NOR gate including one input connected to the output of said AND gate and receiving at another input the other looped intermediate second variable, the output of said NOR gate being connected to said transfer unit and to said inverter.

8. The D-type master-slave flip-flop claimed in claim 1 wherein said slave unit includes two logic gates each having a first input connected to receive a respective one of said second intermediate variables and a second input connected to the output of the other logic gate of said slave unit, the outputs of said logic gates of said slave unit each delivering one of said output variables.

9. The D-type master-slave flip-flop claimed in claim 1 wherein:

said slave unit comprises an AND gate, one input of which receiving one of said second intermediate variables and the output of which is connected to a first input of a NOR gate whose other input receives, in inverted form, the other of said second intermediate variables, the other input of said AND gate is connected to the output of an inverter supplying a first of said output variables, and the output of said NOR gate is connected to said inverter and supplies the other of said output variables.

10. The D-type master-slave flip-flop claimed in claim 1 wherein said transfer unit has an additional control input on at least one of its gates to confer a set or reset function on said flip-flop.

11. A divide by 2 circuit comprising a MOS D-type master-slave flip-flop including:

a master unit receiving first and second input variables and producing two first intermediate variables as a function of one of said input variables, a transfer unit connected to said master unit and including at least two logic gates and a clock connection for applying a clock signal to one input of each of said gates, said gates supplying respective second intermediate variables as a function of said input variable and said clock signal and being looped to said master unit, none of said gates having an output connected to the input of any of the other of said gates, and a slave unit connected to said transfer unit to form an output variable of said slave unit from said second intermediate variables, said output variable of said slave unit being applied to said master unit, wherein:

another input of a first gate of said transfer unit is connected to said master unit to receive directly the true value of one of said first intermediate variables supplied by said master unit, and another input of the second gate of said transfer unit is connected to said master unit to receive therefrom the complement of the same first intermediate variable, wherein one of said second intermediate variables is looped to constitute said first input variable and said second intermediate variables constitute outputs of said divide by 2 circuit in antiphase at a frequency which is half the frequency of said clock signal.

12. The divide by 2 circuit of claim 11 wherein said master unit comprises an inverter to provide the complement of said first intermediate variable.

13. The divide by 2 circuit of claim 11 wherein said master, transfer and slave units each comprise two NAND gates.

14. The divide by 2 circuit of claim 11 wherein said master, transfer and slave units each comprise two NOR gates.

15. The divide by 2 circuit of claim 13, including:

a first gate of said master unit having a first input to which said output variable of said slave unit is applied and a second input to which one of said looped second intermediate variables, is applied, and a second gate of said master unit having a first input to which the output of said first gate is applied and at a second input to which the other of said looped second-intermediate variables is applied, wherein the output of said second gate of said master unit is connected to an input of said first and second gates of said transfer unit, respectively directly and via said inverter.

16. The divide by 2 circuit of claim 14 including:

a first gate of said master unit having a first input to which said output variable of said slave unit is applied and a second input to which one of said looped second intermediate variables is applied, and a second gate of said master unit having a first input to which the output of said first gate is applied and at a second input to which the other of said looped second intermediate variables is applied, and wherein the output of said second gate is connected to an input of said first and second gates of said transfer unit, respectively directly and via said inverter.

17. The divide by 2 circuit of claim 11 wherein said master unit comprises an AND gate receiving at its inputs said output variable of said slave unit and one of said looped second intermediate variables and a NOR gate having one input connected to the output of said AND gate and receiving at another input the other looped intermediate second variable, the output of said NOR gate being connected to said transfer unit and to said inverter.

18. The divide by 2 circuit of claim 11 wherein said slave unit includes two logic gates each having a first input connected to receive a respective one of said second intermediate variables and a second input connected to the output of the other logic gate of said slave unit, the output of one of said logic gates of said slave unit being connected to said master unit.

19. The divide by 2 circuit of claim 11 wherein:

said slave unit comprises an AND gate, one input of which receiving one of said second intermediate variables and the output of which is connected to a first input of a NOR gate whose other input is adapted to receive, in inverted form, the other of said second intermediate variables, the other input of said AND gate is connected to the output of an inverter, and the output of said NOR gate is connected to said inverter and supplies the output variable of said slave unit to said master unit.

20. The divide by 2 circuit of claim 11 wherein said transfer unit has an additional control input on at least one of its gates to confer a set or reset function on said divide by 2 circuit.

* * * * *